(12) United States Patent
Jiang et al.

(10) Patent No.: US 11,073,414 B2
(45) Date of Patent: Jul. 27, 2021

(54) OPTICAL FIBER DETECTION DEVICE FOR DETECTING DISCHARGE FAULT OF HIGH-VOLTAGE BUSHING

(71) Applicant: Nanjing University of Aeronautics and Astronautics, Nanjing (CN)

(72) Inventors: Jun Jiang, Nanjing (CN); Kai Wang, Nanjing (CN); Judong Chen, Nanjing (CN); Wei Li, Nanjing (CN); Yifan Bie, Nanjing (CN); Chaohai Zhang, Nanjing (CN)

(73) Assignee: NANJING UNIVERSITY OF AERONAUTICS AND ASTRONAUTICS, Nanjing (CN)

( * ) Notice: Subject to any disclaimer, the term of this patent is extended or adjusted under 35 U.S.C. 154(b) by 0 days.

(21) Appl. No.: 16/744,087

(22) Filed: Jan. 15, 2020

(65) Prior Publication Data
US 2021/0148735 A1    May 20, 2021

(30) Foreign Application Priority Data
Nov. 18, 2019 (CN) .......................... 201911130059.1

(51) Int. Cl.
  *G01D 5/353* (2006.01)
  *G01H 9/00* (2006.01)
  (Continued)

(52) U.S. Cl.
  CPC ..... *G01D 5/35322* (2013.01); *G01D 5/35325* (2013.01); *G01D 5/35374* (2013.01);
  (Continued)

(58) Field of Classification Search
  CPC .......... G01D 5/35322; G01D 5/35374; G01D 5/35325; G01D 5/35361; G01R 31/08; G01R 15/14; G01R 31/1227; G01H 9/004
  See application file for complete search history.

(56) References Cited

U.S. PATENT DOCUMENTS

| | | | | |
|---|---|---|---|---|
| 4,797,607 A * | 1/1989 | Dupraz | ................ | G01R 15/246 324/117 R |
| 5,136,235 A * | 8/1992 | Brandie | ............... | G01R 15/246 250/227.17 |

(Continued)

FOREIGN PATENT DOCUMENTS

| CN | 101581586 A | 11/2009 |
|---|---|---|
| CN | 107589343 A | 1/2018 |
| CN | 109282839 A | 1/2019 |

*Primary Examiner* — Michael P LaPage
(74) *Attorney, Agent, or Firm* — Dragon Sun Law Firm, PC; Jinggao Li, Esq.

(57) ABSTRACT

The present disclosure relates to an optical fiber detection device for detecting a discharge fault of a high-voltage bushing, which includes an optical fiber sensing unit, an optical fiber delay unit, a photoelectric conversion unit, and a signal collecting and processing unit. The optical fiber sensing unit includes sensing optical fibers; the optical fiber delay unit includes delay optical fibers, a light source, and couplers; the photoelectric conversion unit includes a photodetector; the signal collecting and processing unit includes a high-pass filter. The delay optical fibers are connected to the couplers; an output end of the light source is connected to the light-splitting coupler; an input end of the photodetector is connected to the light-splitting coupler, and an output end of the photodetector is connected to the signal collecting and processing unit; and the light-combining coupler is connected to the sensing optical fibers.

15 Claims, 1 Drawing Sheet

(51) Int. Cl.
  *G01R 15/14* (2006.01)
  *G01R 31/08* (2020.01)
  *G01R 31/12* (2020.01)

(52) U.S. Cl.
  CPC ............ *G01H 9/004* (2013.01); *G01R 15/14* (2013.01); *G01R 31/08* (2013.01); *G01R 31/1227* (2013.01)

(56) References Cited

U.S. PATENT DOCUMENTS

| | | | | |
|---|---|---|---|---|
| 6,163,265 | A * | 12/2000 | Klippel | H02H 1/003 |
| | | | | 324/522 |
| 6,636,321 | B2 * | 10/2003 | Bohnert | G01R 15/246 |
| | | | | 356/483 |
| 7,655,900 | B2 * | 2/2010 | Kurosawa | G01R 15/247 |
| | | | | 250/227.14 |
| 2002/0180416 | A1 * | 12/2002 | Dyott | G01R 15/246 |
| | | | | 324/96 |
| 2005/0088662 | A1 * | 4/2005 | Bohnert | G01R 15/246 |
| | | | | 356/483 |
| 2007/0052971 | A1 * | 3/2007 | Bohnert | G01R 15/247 |
| | | | | 356/491 |
| 2011/0122654 | A1 * | 5/2011 | Haefner | H02B 13/0356 |
| | | | | 363/13 |

* cited by examiner

OPTICAL FIBER DETECTION DEVICE FOR DETECTING DISCHARGE FAULT OF HIGH-VOLTAGE BUSHING

CROSS-REFERENCE TO RELATED PATENT APPLICATION

This application claims priority to and the benefit of CN 201911130059.1, filed Nov. 18, 2019, entitled "Optical Fiber Detection Device for Detecting Discharge Fault of High-Voltage Bushing," by Jun JIANG. The entire disclosure of the above-identified application is incorporated herein by reference.

Some references, which may include patents, patent applications, and various publications, are cited and discussed in the description of the present invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present disclosure relates to the field of optical sensing detection for high-voltage bushing, and in particular to an optical fiber detection device for detecting a discharge fault of a high-voltage bushing.

BACKGROUND

High-voltage bushings include a converter transformer bushing, a wall bushing, a transformer bushing, a reactor bushing, etc., and they are important insulation apparatus in high-voltage and ultra-high-voltage (UHV) transmission and distribution networks. The high-voltage bushing works for a long time in a complex environment of electrical-thermal coupling, which is prone to partial discharge due to the influence of electric, thermal and mechanical stress endangering a safe and stable operation of power grid.

Methods for detecting a partial discharge may be divided into electrical detection and non-electrical detection, based on the difference in the detection parameters. The electrical detection includes pulsed current method, ultra-high frequency (UHF) detection method, acoustic emission detection method and radio frequency (RF) detection method, etc. Using electrical parameters to detect the partial discharge has a high sensitivity, and the measurement is relatively accurate. However, since the structure of the high-voltage bushing on the site is usually complicated, a lot of unnecessary reflections and refractions of electromagnetic waves will be induced during their propagation, leading to significant interference. The non-electrical detection includes infrared temperature measurement method, ultrasonic method and electrochemical method, etc. In ultrasonic detection method, since the detected characteristic parameters are ultrasonic signals, the signals are protected from electromagnetic interference during the detection process, and a live detection of partial discharge and localization of a discharge source can be realized, which has obvious advantages in partial discharge detection. However, the ultrasonic detection method uses an acoustic emission probe to receive ultrasonic signals emitted from partial discharge. Since the acoustic emission probe consists metal components and cannot be installed inside a power supply system for partial discharge signal detection, and also since the bushing has a compact internal structure, severe ultrasonic signal attenuation may occur, making it is difficult to ensure the sensitivity and accuracy of partial discharge detection by means of the ultrasonic detection method using the acoustic emission probe.

An optical interference structure can be used to monitor weak vibration generated by partial discharge of a power transformer. At the same time, the optical fiber is not a metal component and it can be placed inside the transformer to prevent the detected ultrasonic signals from being attenuated due to being affected by the transformer casing without affecting the normal operation of the transformer, thereby achieving live detection and online monitoring of the insulation status of the apparatus. Therefore, the detection of ultrasonic signals of partial discharge based on interference-type optical structure is effective for distinguishing the insulation status of transformer.

Traditional optical sensing probes are classified into two types: with and without skeleton. The sensing probe with skeleton does not have a directivity, and has a high reliability, but the skeleton is usually made of a metal material, it cannot be installed inside the bushing for detection. The sensing probe without skeleton has a high sensitivity, but due to different amplitudes of partial discharge detection at different angles, the detection reliability thereof is poor. Therefore, there are still disadvantages in optical detection in practical applications.

SUMMARY OF THE INVENTION

The object of the present disclosure is to solve the above problems and provide an optical fiber detection device for detecting a discharge fault of a high-voltage bushing.

In order to achieve the above object of the present disclosure, the present disclosure provides an optical fiber detection device for detecting a discharge fault of a high-voltage bushing, which includes: an optical fiber sensing unit, an optical fiber delay unit, a photoelectric conversion unit, and a signal collecting and processing unit. The optical fiber sensing unit includes sensing optical fibers for winding around a high-voltage bushing. The optical fiber delay unit includes delay optical fibers, a light source, a light-splitting coupler, and a light-combining coupler. The photoelectric conversion unit includes a photodetector. The signal collecting and processing unit includes a high-pass filter for reducing low-frequency background noise and eliminating DC offset. The delay optical fibers are connected to the light-splitting coupler and the light-combining coupler. The light-splitting coupler is connected to the light-combining coupler. An output end of the light source is connected to the light-splitting coupler. An input end of the photodetector is connected to the light-splitting coupler, and an output end of the photodetector is connected to the signal collecting and processing unit. The light-combining coupler is connected to the sensing optical fibers.

According to an aspect of the present disclosure, a reflection structure for reflecting an optical signal conducted in the sensing optical fibers is further included.

According to an aspect of the present disclosure, the reflection structure is a Faraday rotator mirror with a single-pass optical rotation of 45°.

According to an aspect of the present disclosure, the signal collecting and processing unit further includes an oscilloscope or a collection card and a wavelet noise reduction and batch processing program.

According to an aspect of the present disclosure, the optical fiber detection device is a Michelson, Mach-Zehnder, or Sagnac-type interference structure, and the Michelson, Mach-Zehnder, or Sagnac-type interference structure is a linear structure, a ring structure, or a dual ring structure. The dual ring structure is a repeated combination of one of the interference structures or a mutual combination of two of the interference structures.

According to an aspect of the present disclosure, the sensing optical fibers are wound around a smooth outer surface of the high-voltage bushing, and are wound in a single direction of the smooth surface. The sensing optical fibers are distributed in entirety in a single-spiral shape on the outer surface of the high-voltage bushing, and both ends of the single-spiral shaped sensing optical fibers are fixed on the high-voltage bushing.

According to an aspect of the present disclosure, when the sensing optical fibers (101) are wound, the optical fibers are closely abutted against each other, and the optical fibers and the high-voltage bushing are closely abutted against each other.

According to an aspect of the present disclosure, the sensing optical fibers are wound around a core and a guide rod of the high-voltage bushing for detecting a weak partial discharge inside the high-voltage bushing; and the sensing optical fibers are wound around a high-voltage bushing casing for detecting a high-energy discharge phenomenon in the high-voltage bushing.

According to the specific solution of the optical fiber detection device for detecting a discharge fault of a high-voltage bushing according to the present disclosure, the following technical effects that cannot be obtained in the related art can be actually obtained:

(1) Anti-electromagnetic interference: The traditional electrical parameter sensor is easily affected by the Hall effect, and is interfered by a strong electromagnetic field in the working environment of the high-voltage bushing, thereby resulting in failure of the detection. The interference-type optical structure adopted by the present disclosure is optical structure. The photoelectric conversion unit has electrical signals but is far away from the high-voltage bushing on the site. Therefore, the overall detection is not susceptible to electromagnetic interference, which effectively reduces detection errors.

(2) The installation position is not limited: In the optical detection technology used in the present disclosure, since the detection device near the high-voltage bushing is a non-metallic component, the normal operation of the bushing will not be affected when a high voltage is applied near the detection device. As compared with other detection methods, the arrangement position of the optical interference structure is relatively random and is not limited by the material properties of the sensing device itself.

(3) High reliability and sensitivity: As compared with the sensing probe in the traditional interference-type optical structure, optical fibers are directly wound around the high-voltage bushing casing or any part in the present disclosure, thereby eliminating the influence of the metal skeleton on the operation of the apparatus and factors such as detection errors caused by angles, which is helpful for improving system reliability and detection accuracy.

According to the specific solution of the optical fiber detection device for detecting a discharge fault of a high-voltage bushing according to the present disclosure, the optical fiber sensing probe is reasonably installed in the high-voltage bushing, and vibration information induced by a discharge fault in the high-voltage bushing is collected by the optical fiber delay unit and the photoelectric conversion unit, so that it can be further determined whether a discharge fault has occurred in the high-voltage bushing and whether to detect and diagnose the discharge fault, thereby solving the problem that the discharge fault in the traditional high-voltage bushing is not easy to detect.

Therefore, a heretofore unaddressed need exists in the art to address the aforementioned deficiencies and inadequacies.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

In order to more clearly illustrate the embodiments of the present disclosure or the technical solutions in the related art, drawings required to be used in the embodiments will be briefly described below. Obviously, the drawings in the following description show only some of the embodiments of the present disclosure, and those skilled in the art can obtain other drawings based on these drawings without creative efforts.

DETAILED DESCRIPTION OF THE INVENTION

Figure 1:
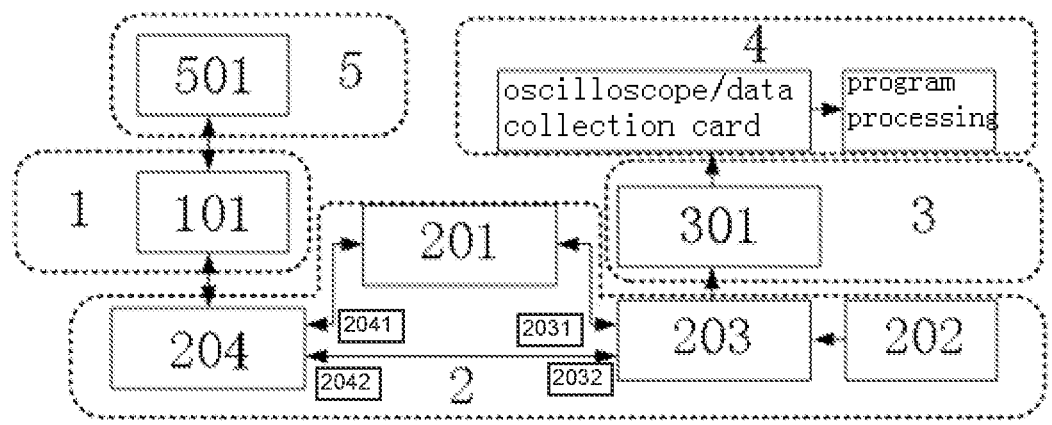
FIG. 1 schematically shows a structural block diagram of an optical fiber detection device for detecting a discharge fault of a high-voltage bushing according to the present disclosure.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure is thorough and complete, and will fully convey the scope of the invention to those skilled in the art. Like reference numerals refer to like elements throughout.

The present disclosure will be described in detail below with reference to the drawings and specific embodiments. It is impossible to describe all the embodiments exhaustively herein, but the embodiments of the present disclosure are not limited to those described below.

FIG. 1 schematically shows a structural block diagram of an optical fiber detection device for detecting a discharge fault of a high-voltage bushing according to the present disclosure. As shown in FIG. 1, the optical fiber detection device for detecting a discharge fault of a high-voltage bushing according to the present disclosure includes an optical fiber sensing unit 1, an optical fiber delay unit 2, a photoelectric conversion unit 3, and a signal collecting and processing unit 4. In the present disclosure, the optical fiber sensing unit 1 includes sensing optical fibers 101. The optical fiber delay unit 2 includes delay optical fibers 201, a light source 202, a light-splitting coupler 203, and a light-combining coupler 204. The photoelectric conversion unit 3 includes a photodetector 301. The signal collecting and processing unit 4 includes a high-pass filter for reducing low-frequency background noise and eliminating DC offset, as well as an oscilloscope or a collection card and a wavelet noise reduction and batch processing program.

In the present disclosure, the sensing optical fibers 101 are wound around a smooth outer surface (i.e., a smooth outer contour surface) of the high-voltage bushing, and are wound in a single direction of the smooth surface. Therefore, it can be known that the sensing optical fibers 101 is distributed in entirety in a single-spiral shape on the outer surface of the high-voltage bushing, and that in the present disclosure, both ends of the single-spiral shaped sensing optical fibers 101 are fixed on the high-voltage bushing, whereas a middle portion of the spiral shaped sensing optical fibers 101 may not be fixed, since the pressing on the fixed two ends and the tight winding can make the position of the sensing optical fibers 101 be stable and secure.

In the present disclosure, when the sensing optical fibers 101 are wound, sections of the optical fibers are closely abutted against each other, and the sensing optical fibers 101 and the high-voltage bushing are closely abutted against each other.

In addition, in the present disclosure, the sensing optical fibers 101 are wound around a core and a guide rod of the high-voltage bushing for detecting a weak partial discharge inside the high-voltage bushing, and the sensing optical fibers 101 are wound around a high-voltage bushing casing for detecting a high-energy discharge phenomenon in the high-voltage bushing, such as severe partial discharge or arc discharge.

The present disclosure will be described below with reference to a specific embodiment.

Figure 2:
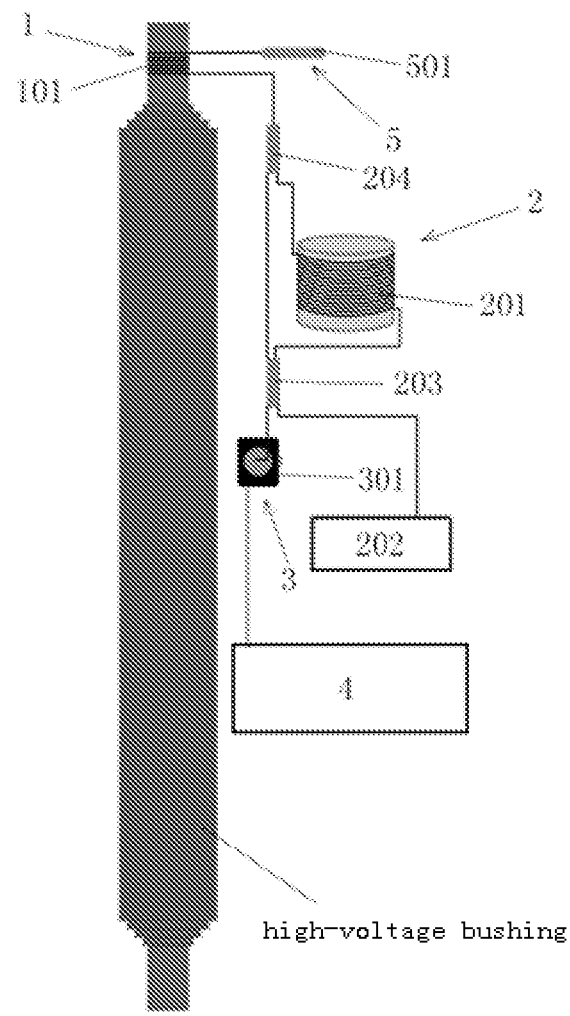
FIG. 2 schematically shows a structural diagram of detecting a high-voltage bushing by an optical fiber detection device for detecting a discharge fault of a high-voltage bushing according to the present disclosure.

FIG. 2 schematically shows a structural diagram of detecting a high-voltage bushing by an optical fiber detection device for detecting a discharge fault of a high-voltage bushing according to an embodiment of the present disclosure. As shown in FIG. 2, in this embodiment, the optical fiber sensing unit 1 includes sensing optical fibers 101 wound around a high-voltage bushing. As shown in FIG. 2, the sensing optical fibers 101 are wound around an outer surface of an upper end of the high-voltage bushing. In this embodiment, ultraviolet glue is also used to fix the sensing optical fibers 101 on the outer surface of the high-voltage bushing. When the bushing generates heat in normal operation due to fault, the operational performance of the ultraviolet glue will not be affected. In this way, the end of the high-voltage bushing on which the sensing optical fibers 101 are wound becomes the optical fiber sensing probe.

As shown in FIG. 1, in this embodiment, the optical fiber delay unit 2 includes delay optical fibers 201, a light source 202, a light-splitting coupler 203 having a first interface 2031 and a second interface 2032, and a light-combining coupler 204 having a first interface 2041 and a second interface 2042. The second interface 2032 of light-splitting coupler 203 is connected to the second interface 2042 of the light-combining coupler 204, and the delay optical fibers 201 are connected to the first interface 2031 of the light-splitting coupler 203 and the first interface 2041 of the light-combining coupler 204 respectively. At the same time, an output end of the light source 202 is connected to the light-splitting coupler 203, and the light-combining coupler 204 is connected to the sensing optical fibers 101.

In this embodiment, the photoelectric conversion unit 3 includes a photodetector 301, which is configured to detect the intensity of an optical signal and convert it into an electrical signal for output. In the detection device of the present disclosure, an input end of the photodetector 301 is generally connected to the coupler, and an output end of the photodetector 301 is connected to the signal collecting and processing unit 4.

In this embodiment, the signal collecting and processing unit 4 includes a filter for reducing low-frequency background noise, as well as an oscilloscope or a collection card and a wavelet noise reduction and batch processing program. In this embodiment, wavelet noise reduction filters out interference and noise signals in the photodetector 301, and the batch processing program establishes a corresponding numerical relationship between the amplitude of the vibration signal in a specific frequency band and the degree of discharge fault.

Further, as shown in FIG. 1, in the present disclosure, a reflection structure 5 is further included, which is mainly configured to reflect a single-path optical signal conducted in the sensing optical fibers 101 so as to form an optical circuit and form an interference phenomenon. In this embodiment, the reflection structure 5 is a Faraday rotator mirror 501 with a single-pass optical rotation of 45°. It can prevent adverse effects of back-transmitted light, generated due to various reasons in the optical path, on the light source and on the optical path system, and can also eliminate a birefringence phenomenon inherent to the optical fibers, so as to improve a coherent signal-to-noise ratio and achieve high-precision measurement of vibrations induced by ultrasonic signals of the partial discharge.

In the present disclosure, the optical fiber detection device is a Michelson, Mach-Zehnder, or Sagnac-type interference structure, and the Michelson, Mach-Zehnder, or Sagnac-type interference structure is a linear structure shown in FIG. 1; of course, in some embodiments, it may also be a ring structure or a dual ring structure known in the art, wherein the dual ring structure is a repeated combination of one of the interference structures or a mutual combination of two of the interference structures. The Sagnac interference structure can use a broadband light source having a low cost and a short coherence length, which helps to suppress the influence of optical path noise such as Rayleigh scattering and Kerr effect in the optical path on an optical fiber gyro.

In addition, the delay optical fibers 201 have different roles in different interference structures, which need to be discussed separately. In the ring interference structure, the detection sensitivity is improved mainly by increasing a length of the optical fibers, whereas in the linear interference structure described above, the interference phenomenon of light occurs at a 2×2 coupler, and the delay optical fibers mainly play the role of phase modulation.

According to the above-described embodiments of the present disclosure, in specific applications, since the Saganc interference structure is adopted as an example in the present disclosure, which has lower requirements on the light source, a broadband light source can be used. The light source can reduce coherence errors and noise caused by Rayleigh scattering, Kerr effect and polarization cross-coupling while saving detection costs. Light emitted from the broadband light source is divided into two beams by a 2×2 coupler. One beam is transmitted to the 1×2 coupler through a 1500 m delay optical fiber, and the other beam is directly transmitted to the 1×2 coupler. The other end of the 1×2 coupler is a sensing probe part of the optical fiber. An optical fiber with a length of 3 m is tightly wound around the high-voltage bushing core and fixed to form the optical fiber sensing probe for receiving or sensing ultrasonic signals caused by weak vibration. As compared with traditional probes, the use of the high-voltage bushing core as the transmission skeleton has the advantages of high reliability, high detection accuracy, etc. Both the sensing optical fibers and the delay optical fibers are bend-insensitive single-mode fibers having a working wavelength of 1260 nm-1625 nm and having characteristics of small light dispersion and transmission distance being affected only by the attenuation of the fibers. The other end of the sensing optical fiber is a Faraday rotating mirror, which can eliminate the birefringence phenomenon inherent to the optical fibers, improve the coherent signal-to-noise ratio, and achieve high-precision measurement of vibrations induced by ultrasonic signals of the partial discharge. An interference occurs in the two forward and backward beams of light emitted by the 2×2 coupler. Since the two light beams pass through the same optical path, when the interferometer is not affected by an external force, the optical path difference of the two beams propagating clockwise and counterclockwise is zero. When there is an ultrasonic signal induced by a vibration outside the Sagnac interference structure, there is an angular velocity in the normal direction of the optical fiber sensing probe. Due to the difference between the forward beam and the backward beam in the time of reaching a disturbed position, a phase difference is formed between the two beams of light, which further causes a corresponding change of the intensity of the interference signal. The magnitude of the angular velocity can be obtained by detecting the intensity of the interference signal by demodulating using a photodiode, so as to achieve the purpose of detecting the ultrasonic signal.

According to the above arrangement of the present disclosure, in consideration of the fact that the sensitivity of the detection structure become better as the length of the optical fiber increases and to enable a reasonable allocation of resources, the optical fiber is cut to an appropriate length and then tightly wound around a surface of the high-voltage bushing in a spiral manner, the wound optical fiber ring is fixed, and a platform for detecting ultrasonic signals of the partial discharge based on the interference-type optical principle is set up to detect weak partial discharges in various high-voltage bushings. Due to the background noise in the detected signals, in order to accurately analyze the partial discharges, wavelet and other programs are used to analyze the background noise for noise reduction. The proposal of the present disclosure can improve the reliability and detection accuracy of detecting partial discharge using an optical method.

At the same time, according to the above arrangement of the present disclosure, the following technical effects that cannot be obtained in the related art can be actually obtained:

(1) Anti-electromagnetic interference: the traditional electrical parameter sensor is easily affected by the Hall effect, and is interfered by a strong electromagnetic field in the working environment of the high-voltage bushing, thereby resulting in failure of the detection. The interference-type optical structure adopted by the present disclosure is optical path topology. The photoelectric conversion unit has electrical signals but is far away from the high-voltage bushing on the site. Therefore, the overall detection is not susceptible to electromagnetic interference, which effectively reduces detection errors.

(2) The installation position is not limited: in the optical detection technology used in the present disclosure, since the detection device near the high-voltage bushing is a non-metallic component, the normal operation of the bushing will not be affected when a high voltage is applied near the detection device. As compared with other detection methods, the arrangement position of the optical interference structure is relatively random and is not limited by the material properties of the sensing device itself.

(3) High reliability and sensitivity: as compared with the sensing probe in the traditional interference-type optical structure, optical fibers are directly wound around the high-voltage bushing casing or any part in the present disclosure, thereby eliminating the influence of the metal skeleton on the operation of the apparatus and factors such as detection errors caused by angles, which is helpful for improving system reliability and detection accuracy.

The above described is only a preferred embodiment of the present disclosure, and is not intended to limit the present disclosure. Any modifications, equivalent substitutions, improvements or the like made within the spirit and scope of the present disclosure are intended to be included in the scope of protection of the present disclosure.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An optical fiber detection device for detecting a discharge fault of a high-voltage bushing, comprising: an optical fiber sensing unit, an optical fiber delay unit, a photoelectric conversion unit, a signal collecting and processing unit, and a reflection structure, wherein the optical fiber sensing unit comprises a sensing optical fiber for winding around a high-voltage bushing;

the optical fiber delay unit comprises a delay optical fiber, a light source, a light-splitting coupler having a first interface and a second interface, and a light-combining coupler having a third interface and a fourth interface;

the photoelectric conversion unit comprises a photodetector;

the signal collecting and processing unit comprises a high-pass filter for reducing low-frequency background noise and eliminating DC offset;

the reflection structure is for reflecting an optical signal conducted in the sensing optical fiber;

the reflection structure, the optical fiber sensing unit, the light combining coupler, the delay optical fiber, the light-splitting coupler, the photoelectric conversion unit, and the signal collecting and processing unit are directly connected to each other in serial, wherein one end of the delay optical fiber is connected to the third interface of the light-combining coupler, and the other end of the delay optical fiber is connected to the first interface of the light-splitting coupler;

the second interface of the light-splitting coupler is connected to the fourth interface of the light-combining coupler;

an output end of the light source is directly connected to the light-splitting coupler;

wherein the optical fiber detection device comprises a light path consisting of the reflection structure, the optical fiber sensing unit, the light combining coupler, the delay optical fiber, the light-splitting coupler and the light source.

2. The optical fiber detection device for detecting a discharge fault of a high-voltage bushing according to claim 1, wherein the reflection structure is a Faraday rotator mirror with a single-pass optical rotation of 45°.

3. The optical fiber detection device for detecting a discharge fault of a high-voltage bushing according to claim 2, wherein the signal collecting and processing unit further comprises an oscilloscope or a collection card and a wavelet noise reduction and batch processing program.

4. The optical fiber detection device for detecting a discharge fault of a high-voltage bushing according to claim 2, wherein the sensing optical fiber is wound around a smooth outer surface of the high-voltage bushing, and are wound in a single direction of the smooth surface; and
wherein the sensing optical fiber is distributed in entirety in a single-spiral shape on the outer surface of the high-voltage bushing, and both ends of the single-spiral shaped sensing optical fiber is fixed on the high-voltage bushing.

5. The optical fiber detection device for detecting a discharge fault of a high-voltage bushing according to claim 4, wherein when the sensing optical fiber are wound, the optical fiber is closely abutted against each other, and the optical fiber and the high-voltage bushing are closely abutted against each other.

6. The optical fiber detection device for detecting a discharge fault of a high-voltage bushing according to claim 5, wherein the sensing optical fiber is wound around a core and a guide rod of the high-voltage bushing for detecting a weak partial discharge inside the high-voltage bushing; and
wherein the sensing optical fiber is wound around a high-voltage bushing casing for detecting a high-energy discharge phenomenon in the high-voltage bushing.

7. The optical fiber detection device for detecting a discharge fault of a high-voltage bushing according to claim 2, wherein the Faraday rotator mirror with the single-pass optical rotation of 45°, the sensing optical fiber, the light combining coupler, the light-splitting coupler, the photodetector, and the signal collecting and processing unit are connected to each other in serial.

8. The optical fiber detection device for detecting a discharge fault of a high-voltage bushing according to claim 1, wherein the signal collecting and processing unit further comprises an oscilloscope or a collection card and a wavelet noise reduction and batch processing program.

9. The optical fiber detection device for detecting a discharge fault of a high-voltage bushing according to claim 1, wherein the sensing optical fiber is wound around a smooth outer surface of the high-voltage bushing, and are wound in a single direction of the smooth surface; and
wherein the sensing optical fiber is distributed in entirety in a single-spiral shape on the outer surface of the high-voltage bushing, and both ends of the single-spiral shaped sensing optical fiber are fixed on the high-voltage bushing.

10. The optical fiber detection device for detecting a discharge fault of a high-voltage bushing according to claim 9, wherein when the sensing optical fiber is wound, the optical fiber is closely abutted against each other, and the optical fiber and the high-voltage bushing are closely abutted against each other.

11. The optical fiber detection device for detecting a discharge fault of a high-voltage bushing according to claim 10, wherein the sensing optical fiber is wound around a core and a guide rod of the high-voltage bushing for detecting a weak partial discharge inside the high-voltage bushing; and
wherein the sensing optical fiber is wound around a high-voltage bushing casing for detecting a high-energy discharge phenomenon in the high-voltage bushing.

12. The optical fiber detection device for detecting a discharge fault of a high-voltage bushing according to claim 1, wherein the signal collecting and processing unit further comprises an oscilloscope or a collection card and a wavelet noise reduction and batch processing program.

13. The optical fiber detection device for detecting a discharge fault of a high-voltage bushing according to claim 1, wherein the sensing optical fiber is wound around a smooth outer surface of the high-voltage bushing, and are wound in a single direction of the smooth surface; and
wherein the sensing optical fiber is distributed in entirety in a single-spiral shape on the outer surface of the high-voltage bushing, and both ends of the single-spiral shaped sensing optical fiber are fixed on the high-voltage bushing.

14. The optical fiber detection device for detecting a discharge fault of a high-voltage bushing according to claim 13, wherein when the sensing optical fiber is wound, the optical fiber is closely abutted against each other, and the optical fiber and the high-voltage bushing are closely abutted against each other.

15. The optical fiber detection device for detecting a discharge fault of a high-voltage bushing according to claim 14, wherein the sensing optical fiber is wound around a core and a guide rod of the high-voltage bushing for detecting a weak partial discharge inside the high-voltage bushing; and
wherein the sensing optical fiber is wound around a high-voltage bushing casing for detecting a high-energy discharge phenomenon in the high-voltage bushing.

\* \* \* \* \*